United States Patent
Lee et al.

(10) Patent No.: US 6,406,743 B1
(45) Date of Patent: Jun. 18, 2002

(54) NICKEL-SILICIDE FORMATION BY ELECTROLESS NI DEPOSITION ON POLYSILICON

(75) Inventors: Chwan-Ying Lee, Tainan; Tzuen-Hsi Huang, Tou Liu, both of (TW)

(73) Assignee: Industrial Technology Research Institute, Hsin-chu (TW)

( * ) Notice: Subject to any disclaimer, the term of this patent is extended or adjusted under 35 U.S.C. 154(b) by 563 days.

(21) Appl. No.: 08/891,127

(22) Filed: Jul. 10, 1997

(51) Int. Cl.[7] .............................. B05D 5/12; H01L 21/44
(52) U.S. Cl. .................. 427/98; 427/305; 427/383.1; 427/438; 438/592; 438/630; 438/649; 438/655; 438/663; 438/664; 438/678; 438/682
(58) Field of Search ................................. 438/592, 649, 438/630, 655, 664, 678, 682, 663; 106/1.11, 1.25; 427/98, 304, 305, 383.1, 438

(56) References Cited

U.S. PATENT DOCUMENTS

| | | | | |
|---|---|---|---|---|
| 4,321,283 A | * | 3/1982 | Patel et al. | 427/74 |
| 4,425,378 A | | 1/1984 | Maher | 427/79 |
| 4,954,214 A | | 9/1990 | Ho | 156/628 |
| 5,097,300 A | * | 3/1992 | Takeuschi | 357/23.3 |
| 5,658,815 A | * | 8/1997 | Lee et al. | 438/304 |

OTHER PUBLICATIONS

"Analysis of Resistance Bahavior in Ti and Ni Salicided Polysilicon Films" IEEE Transactions on Electron Devices, vol. 41, No. 12, Dec. 1994 pp. 2305–2316.
Kikkawa & Sakai, "0.35 $\mu$m Technologies in Japan", Mat Res. Soc. Samp Process, vol. 404, 1996 Materials Research Society, pp. 199–208.

* cited by examiner

*Primary Examiner*—Brian K. Talbot
(74) *Attorney, Agent, or Firm*—George O. Saile; Stephen B. Ackerman; William J. Stoffel

(57) ABSTRACT

The present invention provides a method of manufacturing a nickel-silicide technology for polysilicon interconnects. Nickel 40 is deposited on polysilicon 30 using a electroless process. Using a rapid thermal anneal process, Ni 40 is transformed to NiSi at about 600° C. without any agglomeration. The method comprises forming a polysilicon layer 30 over a substrate 10. The surface 34 of the polysilicon layer is activated. Nickel 40 is selectively electroless deposited onto the surface of the polysilicon layer forming a Nickel layer over the polysilicon layer. The Ni layer 40 is rapidly thermally annealed forming a Nickel silicide layer 36 over the polysilicon layer 30. The rapid thermal anneal is performed at a temperature of about 600° C. for a time of about 40 sec. The Nickel silicide layer 36 preferably comprises NiSi 36B with a low resistivity.

23 Claims, 3 Drawing Sheets

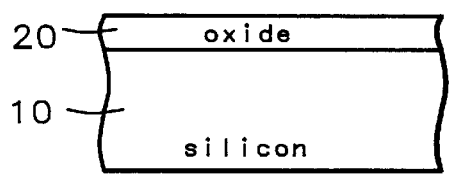
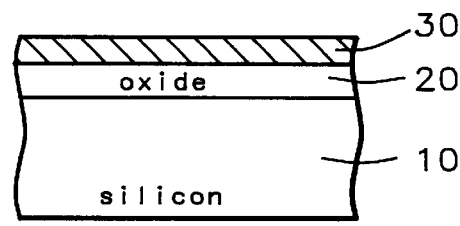
FIG. 1
FIG. 2
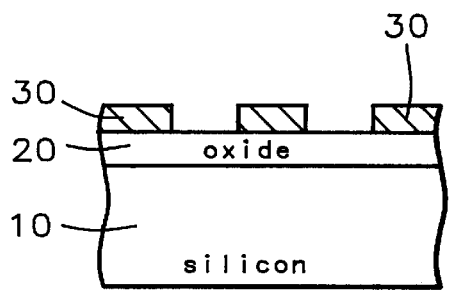
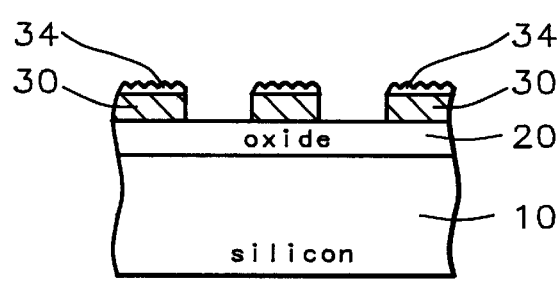
FIG. 3
FIG. 4
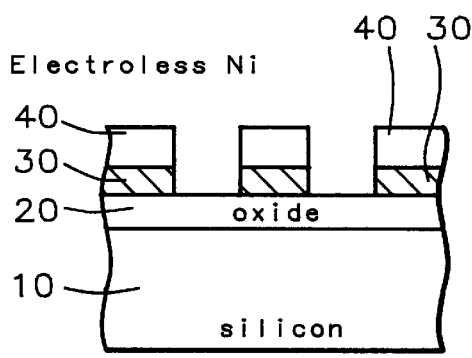
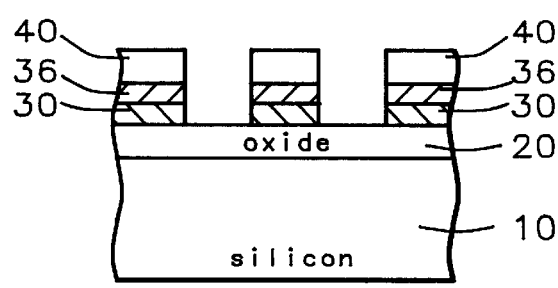
FIG. 5
FIG. 6

NICKEL-SILICIDE FORMATION BY ELECTROLESS NI DEPOSITION ON POLYSILICON

BACKGROUND OF INVENTION

1) Field of the Invention

This invention relates generally to the fabrication of interconnect structures for VLSI semiconductor devices and particularly to the fabrication of Ni silicide interconnects and more particularly to the formation of Nickel Silicide interconnects by electroless Ni deposition on polysilicon.

2) Description of the Prior Art

Individual semiconductor devices in VLSI integrated circuits are interconnected by means of one or more patterned conductive layers overlying the semiconductor devices. It is particularly advantageous to provide a plurality of patterned conductive layers separated from one another and from the underlying semiconductor devices by layers of insulating material. This practice permits a higher density of interconnections per unit area than can be provided by a single patterned conductive layer, and simplifies design by permitting interconnection paths implemented in one conductive layer to cross over interconnection paths implemented in other conductive layers.

Multilevel interconnection structures are conventionally made by alternately depositing and patterning layers of conductive material, typically aluminum alloys such as Al—Si, and layers of insulating material, typically SiO2. The patterning of underlying layers defines a nonplanar topography which complicates reliable formation of overlying layers. In particular, the non-planar topography of underlying conductive layers is replicated in overlying insulating layers to provide vertical steps in the insulating layers. Moreover, small holes are formed in the insulating layers to permit interconnection to underlying conductive layers or device contacts. The subsequent formation of conductive layers overlying the nonplanar topography of the insulating layers is complicated by thinning of the conductive layers at the tops of the steps, cusping or microcracking of the conductive layers at the bottoms of the steps, and formation of voids in the conductive layers in small via and contact holes, all of which can lead to high resistance interconnections or undesired open circuits. Moreover, uneven formation of the conductive layers reduces the resistance of the patterned conductive material to electromigration, reducing the reliability of the completed integrated circuit.

In addition to the insulating/topology issues discuss above, there is a need to improve the metal silicide contacts. In particular, the resistivity of the contacts must be reduced to improve circuit performance. Presently, $TiSi_2$ is a common contact metal. The resistance of $TiSi_2$ should be reduced. Nickel silicide is one of the potential alternatives for replacing $TiSi_2$ because the sheet resistance increases significantly as the line width reduces to the deep submicron range. It has been found that $TiSi_2$-polycide has an abrupt increase in sheet resistance caused by large inter grain layer which increases the sheet resistance in narrow lines. See "Analysis of Resistance Behavior in Ti- and Ni-Salicided Polysilicon Films", IEEE Transactions on Electron Devices, vol., 41, No. 12, December 1994 p. 2305–2316. However, the nickel silicide does not have such significant resistance degradation effect. Conventionally, the nickel silicide was formed by depositing Ni film on the Si substrate by evaporation, followed by annealing in a controlled environment or with rapid thermal processing (RTP). A short coming with this method of Ni Six formation is that NiSix needs to be wet etched to remove unreacted Ni layer. This adds cost to the product costs.

The importance of overcoming the various deficiencies noted above is evidenced by the extensive technological development directed to the subject, as documented by the relevant patent and technical literature. The closest and apparently more relevant technical developments in the patent literature can be gleaned by considering U.S. Pat. No. 4,425,378 (Maher) shows a method of electroless Ni plating. U.S. Pat. No. 4,954,214(Ho) shows a method of forming interconnect structures using a nickel deposited by selective electroless Ni plating. See Col. 7, lines 64 to Col. 8, lines 16. Also, Kikkawa and Sakai "0.35 $\mu$m Technologies in Japan" Mat. Res. Soc. Sump Process Vol. 404 1996 Materials Research Society p. 199–298, and Ohguro, et al., "Analysis of Resistance Behavior in Ti- and Ni-Salicided Polysilicon Films", IEEE Transactions on Electron Devices, Vol., 41, No. 12, December 1994 p. 2305–2316, discuss relevant prior art.

There is a need for an alternative method by which the nickel can be deposited by electroless plating, and subsequently annealing to form a low resistivity nickel silicide.

There is a need to develop an improved electroless deposition that can selectively deposit on a catalysis surface and not affect the underlying isolation layer ($SiO_2$)

SUMMARY OF THE INVENTION

It is an object of the present invention to provide a method for fabricating a Ni-silicide Formation on Polysilicon using electroless Ni Deposition technique.

It is an object of the present invention to provide a method for fabricating a Ni-silicide interconnect on Polysilicon using electroless Ni Deposition technique.

It is an object of the present invention to form a Ni-salicided structure using electroless Ni deposition technique and rapid thermal anneal (RTA) technique.

To accomplish the above objectives, the present invention provides a method for Nickel silicide 36 formation by Electroless Ni deposition on Polysilicon 30 and rapid thermal annealing. The invention has four preferred electroless Ni plating electroless solutions. The invention also has a preferred RTA process performed at about 600° C. This anneal produces a low resistivity Ni silicide 36A (NiSi— about 1:1 Ni to Si ratio) that has a low resistivity without any agglomeration. The Ni silicide interconnect of the invention is preferably used in a salicide process in a semiconductor device as shown in FIG. 10.

The method of the invention preferably comprises the following steps:

a) See FIG. 1—forming a first insulting layer over a substrate;

b) See FIG. 2—forming a polysilicon layer 30 over the substrate 10;

c) See FIG. 3—patterning the polysilicon layer 30 to form interconnections;

d) See FIG. 4—activating the surface of the polysilicon layer by bringing into contact a solution of $PdCl_2$ in HF and $CH_3COOH$ for between about 8 and 12 sec (tgt 10 seconds) at temperature between 60 and 70° F. (room temperature);

e) See FIG. 5—selectively electroless depositing Ni onto the surface of the polysilicon layer forming a Ni layer over the polysilicon layer (using the Pd particles as a catalyst); the selectively electroless depositing Ni performed at the following conditions: (solution 1) a Nickel sulfate concentration between about 24 and 35 g/l) (tgt.=30 g/L), Sodium Hypophosphite at a concentration between about 7.5 and 10 g/l (tgt=7.5 g/l) ammonium chloride at a concentration between about 6 and 10 g/l (tgt=8); Ethylene diamine (complexing agent) at a concentration between about 50 and 70 (tgt=600 g/l) and at a temperature between about 70 and 72° C. (tgt=72° C.) and at a pH between about 9.8 and 10.2 (tgt=10);

f) See FIG. 6—Rapidly thermally annealing the substrate forming a Nickel silicide layer 36 between the Ni Layer 40 and the polysilicon layer 30; the rapid thermal anneal performed at a temperature in a range of between about 400 and 750° C. (tgt=600° C.) for a time in a range of between about 39 and 60 seconds (tgt=40 sec) and with a nitrogen flow in a range of between about 2 and 5 slm (tgt=5 slm); the Ni silicide layer 36 is preferably composed of NiSi 36A; and g) See FIG. 7—removing by wet etching the Ni layer 40 thereby leaving the Ni silicide layer 36 the polysilicon layer 30 over the substrate.

The method of this invention has many advantages, such as excellent uniformity, fast deposition rate and superior selectivity. The RTA process of the invention produces low resistivity a NiSi layer 36A without agglomeration.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which:

FIGS. 1, 2, 3, 4, 5, 6 and 7 are cross sectional views for illustrating a process for forming Ni silicide over polysilicon using an electroless deposition and RTA process according to the method of the present invention.

DETAILED DESCRIPTION OF THE PREFERRED EMBODIMENTS

Figure 7:
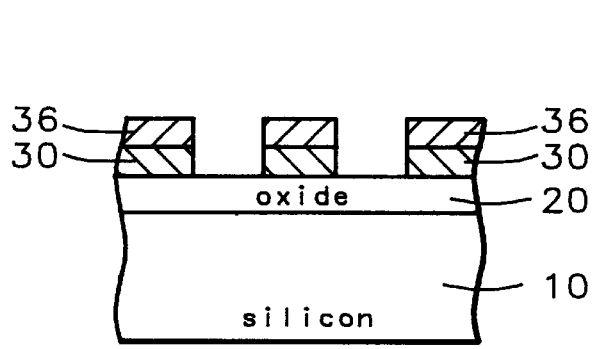

The present invention will be described in detail with reference to the accompanying drawings. The present invention provides a method of forming a low resistivity nickel-silicide 36 36A 36B for poly interconnects. See FIGS. 7 & 10. Transmission electron microscopy (TEM) was utilized to study the nickel silicide growth in thin film couple depositing Ni layer on poly Si by electroless deposition method. Energy-dispersive spectroscopy and selected area diffraction (SAD) were used to identify the phases and structures of Ni-silicide. See FIG. 8. A major point of the invention is that it was found that invention's RTA process transforms the electroless Ni film 40 on polysilicon 30 to a low resistivity NiSi (about 1:1 ratio) layer 36A at about 600° C. (up to 750° C. ) over a long period without any agglomeration. Agglomeration is the silicide islands formation. These silicide islands increase the resistivity of silicide film and result in serious reliability issues.

Nickel silicide is one of the potential alternatives for replacing $TiSi_2$ because the sheet resistance of TiSix increases significantly as the line width reduces to the deep submicron range. However, the nickel silicide does not have such significant resistance degradation effect. The conventional process of forming nickel silicide is depositing Ni film on the Si substrate by evaporation, followed by annealing. Now, we put forward the alternative method of the invention by which the nickel is deposited by electroless plating, and subsequently annealed to form a low resistivity, agglomerate free, nickel silicide layer.

FIGS. 1 through 7 show the invention's process for forming a nickel silicide layer 36. As shown in FIG. 1, a first insulating layer 20 is formed over a semiconductor structure 10 or substrate. The first insulating layer represents an upper layer in a semiconductor device over which the metallization of the invention is formed. (e.g., layer 140 in FIG. 10.)

Figure 10:
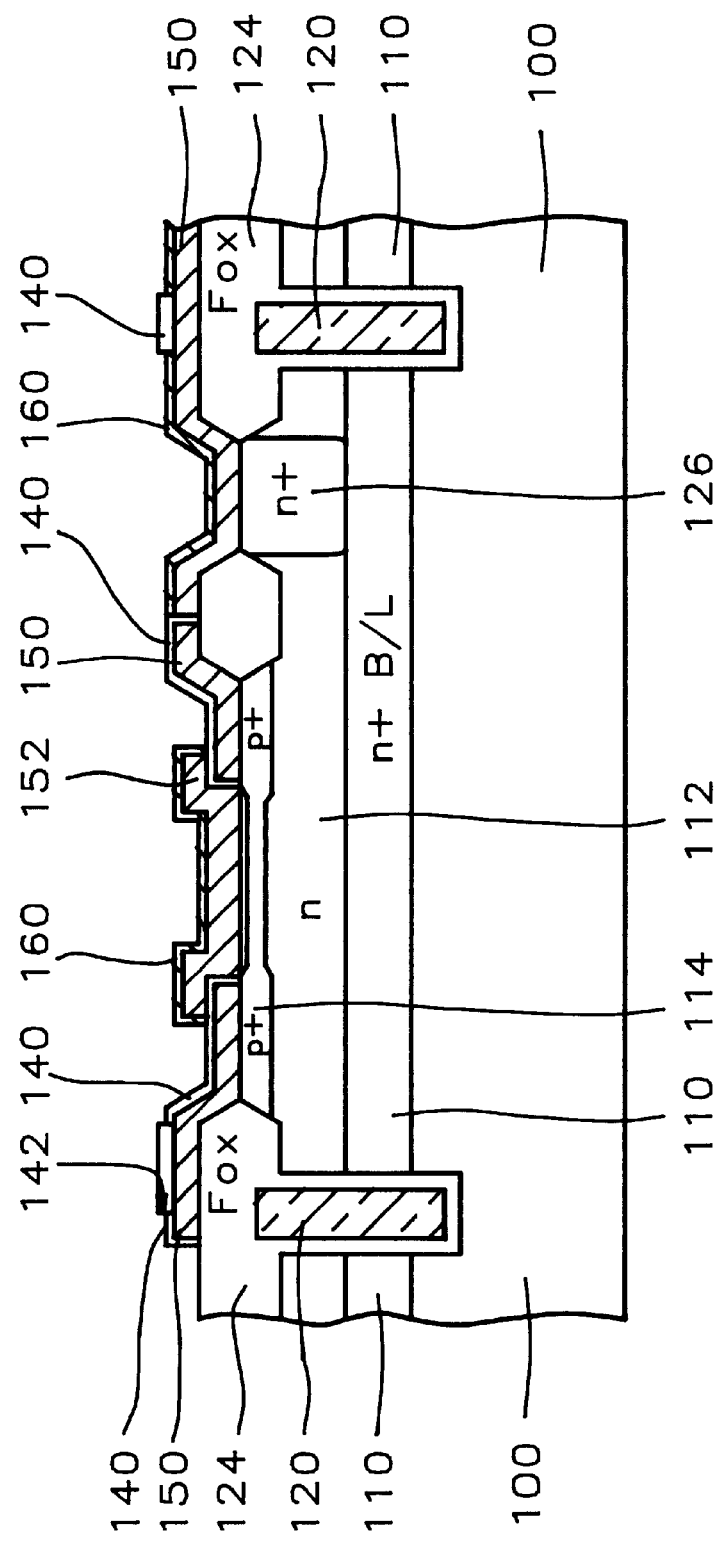
FIG. 10 is a cross sectional view of a semiconductor device having the Ni Silicide structure formed according to the present invention.

The substrates are preferably p-type silicon, with a resistivity of 15–25 ohm-cm. The silicon surface wafers 10 are preferably cleaned with sulfuric acid, rinsed in DI water, followed by etching in 10 vol % HF solution and rinsing again in DI water. It is understood that the substrate 10 in the figure can represent a semiconductor structure which can comprise many doped region (e.g., S/D regions) therein, and insulating (e.g., doped and undoped oxides) and conducting layers (e.g., polysilicon, metal, etc.) over a silicon substrate. Such as shown in FIG. 10.

As shown in FIG. 2, a polysilicon layer 30 is formed over the substrate 10. The polysilicon layer 30 preferably has a thickness in a range of between about 1500 and 2500 Å(tgt=2000 Å_/+200). The polysilicon is preferably deposited by a LPCVD or sputtering process.

As shown in FIG. 3, the polysilicon layer 30 is preferably patterned to form interconnections 30. The pattern of the polysilicon layer is customized to the particular chip being fabricated as known to those skilled in the art. The polysilicon layer 30 can represent any surface that a silicide layer or salicide contact is made to on a semiconductor device (e.g., a silicon layer.)

As shown in FIG. 4, the surface of the polysilicon layer 30 is preferably activated. Element 34 represents the activated surface. The polysilicon surface (or Silicon surface) is preferably activated by bringing it into contact with a solution of $PdCl_2$ in HF and $CH_3COOH$ for between about 8 and 12 sec (tgt 10 seconds) at temperature between 60 and 70° F. (e.g., room temperature). During the activation, the Pd atoms may be absorbed into the polysilicon surface.

TABLE 1

| Activation Solution Composition | | | |
| --- | --- | --- | --- |
|  | Low limit | High Limit | Units |
| Palladium Chloride | 0.1 | 0.2 | g/l |
| glacial Acetic acid | 450 | 550 | Ml/l |
| Hydrofluoric acid | 200 | 300 | ML/L |

This activation is an optional process. Electroless nickel can deposit on the polysilicon without any activation process. However, the uniformity of thickness is worse that with the activation process.

As shown in FIG. 5, afterwards a nickel layer 40 is deposited by electroless deposition. The Ni is selectively electroless deposited onto the surface of the polysilicon layer 30 forming a Ni layer 40 over the polysilicon layer 30 using the Pd particles as a catalyst. The thickness of electroless Ni film is preferably between about 1800 and 2200 Å. Deposition was conducted in a pH 10 solution at between 87 and 93° C. and more preferably about 90° C.

The selectively electroless deposition of Nickel is preferably performed using the four solutions/conditions. The four different solutions form different compositions of the electroless Ni deposited as shown below in table 2.

TABLE 2

The Atomic Percentage Of The Deposited Ni Using The Four Solutions

| solution | Ni (wt %) (+/− 1%) | P (wt %) (+/− 1%) | B (Wt %) (+/− 1%) |
|---|---|---|---|
| 1 | 96 | 4 | 0 |
| 2 | 97 | 0 | 3 |
| 3 | 93.5 | 6.5 | 0 |
| 4 | 91.5 | 8.5 | 0 |

The selectively electroless deposition of Ni is preferably performed at the using the 4 solutions/conditions shown below in the tables.

TABLE 3

The composition of the Ni-P solution (1)

| The composition of the Ni solution | Low limit | tgt/units | high limit |
|---|---|---|---|
| Nickel sulfate | 25 | 30 g/L | 35 |
| Sodium hypophosphite | 6.5 | 7.5 g/l | 10 |
| Ammonium Chloride | 6 | 8.0 g/L | 10 |
| Ethylene diamine - complexing agent | 50 | 60 g/L | 70 |
| Temperature | 70 | 72° C. | 75 |
| pH | 9.8 | 10 | 10.2 |

TABLE 4

The composition of the Ni-B solution (2)

| The composition of the Ni solution | Low limit | tgt/units | high limit |
|---|---|---|---|
| Nickel sulfate | 25 | 30 g/L | 35 |
| Dimethylamine borane | 2.5 | 3.0 | 3.5 |
| latic acid - complexing agent | 20 | 25.0 g/L | 30 |
| Citric acid - complexing agent | 20 | 25.0 g/L | 30 |
| Ammonium chloride | 20 | 30 g/L | 40 |
| Thiourea - increases brightness of resulting Ni coating | 0.8 | 1 mg/L | 1.2 |
| Temperature | 56 | 60° C. | 65 |
| pH | 5.8 | 6 | 6.2 |

TABLE 5

The composition of the Ni-P solution (3)

| The composition of the Ni-P solution | Low limit | tgt/units | high limit |
|---|---|---|---|
| Nickel sulfate | 26 | 28 g/L | 30 |
| Sodium citrate | 55 | 60 g/l | 65 |
| Ammonium sulfate | 60 | 65 g/l | 70 |
| Sodium hypophosphite | 16 | 17 g/l | 18 |
| pH | 8.5 | 9.1 | 9.5 |

TABLE 6

The composition of the Ni- solution (4)

| The composition of the Ni-P solution | Low limit | tgt/units | high limit |
|---|---|---|---|
| Nickel chloride | 20 | 25 g/l | 30 |
| Sodium hypophosphite | 25 | 27 g/l | 30 |
| sodium succinate hypophosphite | 12 | 16 g/l | 20 |
| pH | 4.3 | 4.6 | 5.0 |

As shown in FIG. 6, the substrate is rapidly thermally annealed (RTA) thereby forming a Nickel silicide layer 36 between the Ni Layer 40 and the polysilicon layer 30. The rapid thermal anneal is performed at a temperature in a range of between about 400 and 750° C. and more preferably between 590 and 610° C. (tgt=600° C.) and preferably for a time in a range of between about 30 and 60 sec (tgt=40 sec) and with a nitrogen flow in a range of between about 2 and 5 slm (tgt=5 slm).

For the specimens annealed at about 450° C., it was observed that the nickel silicide were formed between the electroless nickel deposit 30 and poly Si 20. For the specimen annealed at 450° C. (even as low as 400° C.), the nickel may react with polysilicon to form the nickel silicide with 2 compositions: $Ni_2Si$ and $Ni_3Si_2$. These silicide have a higher resistivity. When the wafer annealed at 600° C., the NiSi Phase formed and its resistivity is so low that can be used as interconnect material.

TABLE 7 composition of the Ni silicide layer 36 as function of anneal temperature

| Anneal Temp | Composition of the Ni Silicide layer | Resistivity ($\mu$Ohms*cm) | Figure |
|---|---|---|---|
| 450° C. | Ni2Si | 25 | 9A |
| 600° C. | NiSi | 20 | 9B |
| 750° C. | NiSi2 | 35 | 9C |

Figure 9A:
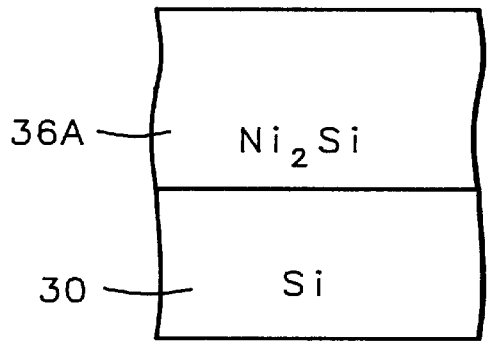
FIGS. 9A, 9B and 9C show the different compositions of the Ni silicide layer 36 of the present invention at different anneal temperatures.
Figure 9B:
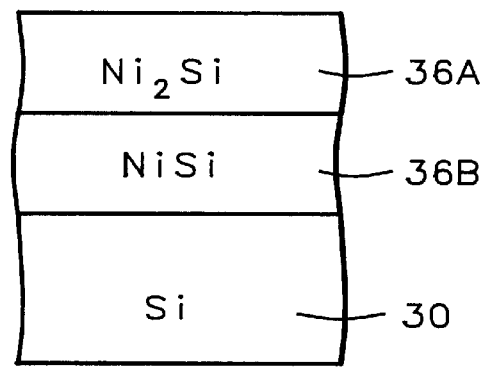
Figure 9C:
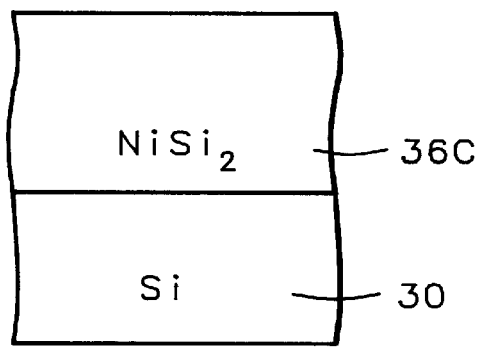

FIG. 9A represents the Ni suicide layer 36A after an anneal at about 450° C. FIG. 9B represent the Ni silicide layer 36 annealed at about 600° C. composed of two layers: an lower layer (NiSi) 36B and an upper layer (Ni2Si) 36A. The lower silicide layer 36B preferably has a composition of NiSi with a ratio of Ni to Si between 0.9 and 1.1. FIG. 9C represents a Ni silicide layer annealed at about 750° C. composed of NiSi2. The compositions of the layers 36A 36B 36C preferably range within +/−10% of the atomic ratios of their formulas.

As shown in FIG. 7, the any excess Ni layer 40 can be removing by an optional wet etching thereby leaving the Ni silicide layer 36 the polysilicon layer 30 over the substrate. The Ni layer is preferably removed using a 2 solution etch. The first solution is a 50 to 100% $HNO_2$ at a temperature 72+/−10° F.(room temperature). Solution 2 is composed of $H_2O_2$ and $H_2SO_4$ at about 60+/−10° C.

Figure 8:
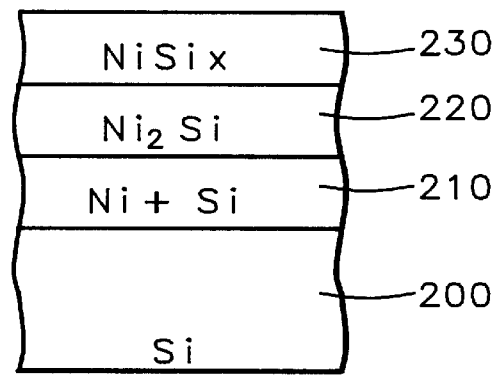
FIG. 8 is a cross-sectional view of the Ni Silicide structure as view by TEM analysis formed according to the present invention.

FIG. 8 is a cross sectional representation of a Ni structure of the current invention. FIG. 8 represents a cross section of the invention's Ni structure that was analyzed by TEM and other techniques. The Ni silicide layer 36 can be is composed of three layers 210 222 230 having different compositions. The three layers of the Ni Silicide layer 36 are a lower 210 NiSi layer, a middle layer 220 of $Ni_2$ Si and a top NiSi, layer 230. FIG. 8 shows a cross-sectional TEM image of a specimen that was annealed at 600° C. for 30 min in the furnace. Quantitative analysis from energy-dispersive spectroscopy is shown in Table 8 below. The region 200 of FIG. 8 is Si wafer, region 210 predominantly consisted of Ni and Si. P (phosphorous) was depleted from region 201. The composition of region 220 is corresponding to the $Ni_2Si$ phase. P was also depleted from region 220, instead P simply remained over the silicide layer (region 230). Also, a bright-field TEM micrograph and electron diffraction pattern (not shown) of the nickel silicide layer after annealing at 750° C. for 30 minutes was taken. The silicide formation was also determined by analysis of EDS and it agrees very well with those identified by diffraction pattern analysis. A cross-sectional TEM photograph of the wafer that was annealed at 750° C. for 30 minutes. The formed silicide phase is NiSi by EDS and SAD analysis. Smooth surfaces on the silicide layers were confirmed without any agglomeration for all cases. Hence, it is strongly proposed that the nickel silicide technology by electroless Ni deposition can be applied to the sub-micron poly interconnect.

In summary three different composition Ni silicide layer were formed using the inventor's electroless Ni layers and anneal process. The preferred Ni silicide layer has the NiSi composition 36A which has the lowest resistivity. The 600° C. anneal process produces the more of this NiSi composition silicide layer.

TABLE 8

The composition of the element at the sample after annealing at 600° C. for 30 minutes

| layer - See | Compositions by EDS | | |
|---|---|---|---|
| FIG. 8 | Ni | Si | P |
| 200 | 0 | 100 | 0 |
| 210 | 49.26 | 50.47 | 0.27 |
| 220 | 59.22 | 40.04 | 0.74 |
| 230 | 90.27 | 1.52 | 8.21 |

FIG. 10 shows one possible implementation of the Nickel Silicide process of the invention used in an interconnect. FIG. 10 shows a substrate 100, with Buried layer (BL) 110, Well 112, isolations 120 and 124, formed therein. Next, extrinsic base regions 114, N+ deep collector region 126, are formed using conventional processes. A polysilicon layer (Contact) 150 is formed and patterned. An insulating layer 140 is deposited and patterned as shown to form openings 142. Another polysilicon layer is deposited and patterned to form the gate layer 152. Ni Silicide is then formed on the exposed areas of the contact 150 and the gate using the process of the invention as described above and shown in FIGS. 1 through 7). The nickel silicide layer 160 represents layer 36 shown in FIG. 7. The nickel silicide layer 160 preferably represents layers 36A and 36B shown in FIGS. 9A and 9B. The nickel silicide layer 160 represents the NiSi 36b and $Ni_2Si$ (or Ni3 Si2) 36a phases formed after RTA annealing at about 600° C.

The invention provides a method for Nickel silicide 36 formation by Electroless Ni deposition on Polysilicon 30. The invention's Nickel silicide 36 formation by Electroless Ni deposition is high applicable to sub-micron poly interconnects. The method of this invention has many advantages, such as excellent uniformity, fast deposition rate and superior selectivity, superior step coverage and the electroless plating only deposits on the surface of a catalytic substrate.

The Ni Si-polycide 36 of the present invention show less line-width dependence than the comparable $WSi_x$ and TiSix processes. The sheet resistance even decreases slightly as the line width decreases. The silicidation of Nickel Si takes place in the poly-Si layer by Ni diffusion from the Ni layer 40 into poly-Silicon 30. See FIG. 6. The narrow NiSi-Polycide line has thicker silicide so that the effective thickness of NiSi is greater and therefore has a lower resistance.

The invention forms low resistivity Nickel silicide using electroless Ni technique that has the advantage of being compatible with conventional IC processes. The process of the invention is preferably implemented a salicide process using electroless Ni and RTA. The RTA process can consume all of the electroless Ni layer 40 thereby eliminating the wet etching process used in conventional Ni silicide processes.

While the invention has been particularly shown and described with reference to the preferred embodiments thereof, it will be understood by those skilled in the art that various changes in form and details may be made without departing from the spirit and scope of the invention.

What is claimed is:

1. A method for a Nickel silicide formation in an integrated circuit by Electroless Ni deposition on Polysilicon and rapid thermal annealing comprising the following steps:
   a) forming and patterning a polysilicon layer over a substrate;
   b) selectively electroless depositing Nickel over said polysilicon layer forming a Nickel layer over said polysilicon layer;
   c) rapidly thermally annealing said substrate forming a nickel silicide layer over said polysilicon layer; said nickel silicide layer forming part of a semiconductor integrated circuit device; said rapid thermal anneal is performed at a temperature in a range of between about 400 and 750° C. for a time in a range of between about 30 and 60 sec and with a nitrogen flow whereby said nickel silicide layer does not have agglomeration.

2. The method of claim 1 which further includes after step c): removing said Nickel layer by wet etching thereby leaving said Nickel silicide layer over said substrate.

3. The method of claim 1 wherein said polysilicon layer and said Nickel silicide layer comprise interconnects on a semiconductor device.

4. The method of claim 1 which further includes after step a) and before step b):
   a) patterning said polysilicon layer to form interconnections; and
   b) activating the surface of said polysilicon layer by bringing into contact a solution of $PdCl_2$ in HF and $CH_3COOH$ for between about 8 and 12 seconds at temperature between 60 and 70° F.

5. The method of claim 1 wherein said Nickel silicide layer is composed of a lower NiSi layer, and an upper $Ni_2Si$ layer and said rapid thermal anneal performed at a temperature in a range of between about 590 and 610° C. for a time in a range of between about 30 and 60 sec and with a nitrogen flow in a range of between about 2 and 5 slm.

6. The method of claim 1 wherein the selectively electroless depositing Nickel is performed with a Ni—P solution at the following conditions: a Nickel sulfate concentration between about 25 and 35 g/l, Sodium Hypophosphite at a concentration between about 7.5 and 10 g/l ammonium chloride at a concentration between about 6 and 10 g/l; Ethylene diamine at a concentration between about 50 and 70 g/l and at a temperature between about 70 and 75° C. and a pH between about 9.8 and 10.2 and said Nickel layer has a composition of Ni in the range of 95 and 97 wt % and P in a range of between about 3 and 5 wt %.

7. The method of claim 1 wherein the selectively electroless depositing Ni is performed with a Ni—B solution at the following conditions: Nickel sulfate concentration between 25 and 35 g/L, Dimethylamine borane concentration between 2.5 and 3.5 g/l, latic acid concentration between 20 and 30 g/L, Citric acid concentration between 20 and 30 g/L, Ammonium chloride concentration between 20 and 40 g/l, Thiourea concentration between 0.8 and 1.2 mg/L; and at a Temperature between 56 and 65° C.; at a pH between 5.8 and 6.2; and said Nickel layer has a composition of Ni between 96 and 98 wt % and B between 2 and 4 wt %.

8. The method of claim 1 wherein the selectively electroless depositing Ni is performed with a Ni—P solution at the following conditions: a Nickel sulfate concentration between 26 and 30 g/L, Sodium citrate concentration between 55 and 65 g/L, Ammonium sulfate concentration between 60 and 70 g/l, Sodium hypophosphite concentration between 16 and 18 g/l; at a pH between 8.5 and 9.5; and said Nickel layer has a composition of Ni between 92.5 and 94.5 wt % and P between 5.5 and 7.5 wt %.

9. The method of claim 1 wherein the selectively electroless depositing Nickel is performed with a Ni—P solution at the following conditions: Nickel chloride concentration between 20 and 30 g/l, Sodium hypophosphite concentration between 25 and 30 g/l, sodium succinate hypophosphite 12 and 20 g/l; and a pH between 4.3 and 5.0; and said Nickel layer has a composition of Ni between 90.5 and 92.5 wt % and P between 7.5 and 9.5 wt %.

10. The method of claim 1 wherein said polysilicon layer having a thickness in a range of between about 1800 and 2200 Å.

11. The method of claim 1 wherein said rapid thermal anneal is performed at a temperature in a range of between about 590 and 610° C. for a time in a range of between about 30 and 60 sec and with a nitrogen flow in a range of between about 2 and 5 standard liters per minute.

12. A method for a Nickel silicide formation in an integrated circuit by electroless Nickel deposition on Polysilicon and rapid thermal annealing comprising the following steps:
   a) forming a first insulating layer over a substrate;
   b) forming a polysilicon layer over said insulating layer;
   c) patterning said polysilicon layer to form interconnections;
   d) activating the surface of said polysilicon layer with a solution of containing $PdCl_2$;
   e) selectively electroless depositing Nickel onto said surface of said polysilicon layer forming a Nickel layer over said polysilicon layer; and
   f) rapidly thermally annealing said substrate forming a Nickel silicide layer over said polysilicon layer; said rapid thermal anneal performed at a temperature in a range of between about 590 and 610° C. for a time in a range of between about 30 and 60 sec in a nitrogen flow; and said nickel silicide layer composed of an upper and a lower silicide layer, said lower silicide layer having a composition of NiSi with a ratio of Ni to Si between 0.9 and 1.1.

13. The method of claim 12 which further includes after step f): removing said Nickel layer by wet etching thereby leaving said Nickel silicide layer over said substrate.

14. The method of claim 12 wherein activating the surface of said polysilicon layer comprises bringing into contact a solution of $PdCl_2$ in HF and $CH_3COOH$ for between about 8 and 12 seconds at temperature between 60 and 70° F.

15. The method of claim 12 wherein said nickel silicide layer composed of an upper and a lower silicide layer, said lower silicide layer having a composition of NiSi with a ratio of Ni to Si between 0.9 and 1.1.

16. The method of claim 12 wherein the selectively electroless depositing Nickel is performed with a Ni—P solution at the following conditions: a Nickel sulfate concentration between about 25 and 35 g/l, Sodium Hypophosphite at a concentration between about 7.5 and 10 g/l ammonium chloride at a concentration between about 6 and 10 g/l; Ethylene diamine at a concentration between about 50 and 70 g/l and at a temperature between about 70 and 75° C. and a pH between about 9.8 and 10.2, and said Nickel layer has a composition of Ni in the range of 95 and 97 wt % and P in a range of between about 3 and 5 wt %.

17. The method of claim 12 wherein the selectively electroless depositing Nickel is performed with a Ni—B solution at the following conditions: Nickel sulfate concentration between 25 and 35 g/L, Dimethylamine borane concentration between 2.5 and 3.5 g/l, latic acid concentration between 20 and 30 g/L, Citric acid concentration between 20 and 30 g/L, Ammonium chloride concentration between 20 and 40 g/l, Thiourea concentration between 0.8 and 1.2 mg/L; and at a Temperature between 56 and 65° C.; at a pH between 5.8 and 6.2; and said Nickel layer has a composition of Ni between 96 and 98 wt % and B between 2 and 4 wt %.

18. The method of claim 12 wherein the selectively electroless depositing Ni is performed with a Ni—P solution at the following conditions: Nickel sulfate concentration between 26 and 30 g/L, Sodium citrate concentration between 55 and 65 g/L, Ammonium sulfate concentration between 60 and 70 g/l, Sodium hypophosphite concentration between 16 and 18 g/l; at a pH between 8.5 and 9.5; and said Nickel layer has a composition of Ni between 92.5 and 94.5 wt % and P between 5.5 and 7.5 wt %.

19. The method of claim 12 wherein the selectively electroless depositing Nickel is performed with a Ni—P solution at the following conditions:

| The composition of the Ni-P solution | Low limit | high limit |
| --- | --- | --- |
| Nickel chloride | 20 | 30 |
| Sodium hypophosphite | 25 | 30 |
| sodium succinate hypophosphite | 12 | 20 |
| pH | 4.3 | 5.0 | and said Nickel layer has a composition of Ni between 90.5 and 92.5 wt % and of P between 7.5 and 9.5 wt %.

20. A method for a Nickel silicide formation in an integrated circuit by electroless Nickel deposition on Polysilicon and rapid thermal annealing comprising the following steps:
   a) forming a first insulating layer over portions of a substrate;
   b) forming a polysilicon layer over parts said first insulating layer and over said substrate;
   c) patterning said polysilicon layer to form interconnections;
   d) activating the surface of said polysilicon layer by bringing into contact a solution of $PdCl_2$ in HF and $CH_3COOH$ for between about 8 and 12 seconds at temperature between 60 and 70° F.;
   e) selectively electroless depositing Nickel onto said surface of said polysilicon layer forming a Nickel layer over said polysilicon layer; the selectively electroless depositing Nickel performed with a solution at the following conditions: a Nickel sulfate concentration between about 25 and 35 g/l, Sodium Hypophosphite at a concentration between about 7.5 and 10 g/l ammonium chloride at a concentration between about 6 and 10 t/l; Ethylene diamine at a concentration between about 50 and 70 g/l and at a temperature between about 70 and 75° C., and a pH between about 9.8 and 10.2 and said Nickel layer has a composition of Ni in the range of 95 and 97 wt % and P in a range of between about 3 and 5 wt % f) rapidly thermally annealing said substrate forming a Nickel silicide layer over said polysilicon layer; said rapid thermal anneal performed at a temperature in a range of between about 590 and 610° C. for a time in a range of between about 30 and 60 sec and with a nitrogen flow in a range of between about 2 and 5 standard liters per minute; said nickel silicide layer composed of an upper and a lower silicide layer, said lower silicide layer having a composition of NiSi with a ratio of Ni to Si between 0.9 and 1.1.

21. The method of claim 20 wherein after step f), removing said Nickel layer by wet etching thereby leaving said Ni silicide layer said polysilicon layer over said substrate.

22. The method of claim 12 wherein said Nickel silicide layer is used in a salicide process in a semiconductor device.

23. The method of claim 20 wherein said Nickel silicide layer is used in a salicide process in a semiconductor device.

* * * * *